United States Patent
Schwab et al.

(10) Patent No.: US 6,530,381 B1
(45) Date of Patent: Mar. 11, 2003

(54) PROCESS FOR THE WET-CHEMICAL SURFACE TREATMENT OF A SEMICONDUCTOR WAFER

(75) Inventors: Günter Schwab, Emmerting (DE); Karlheinz Langsdorf, The Makena (SG); Maximilian Stadler, Haiming (DE); Edeltraut Pichelmeier, Falkenberg (DE)

(73) Assignee: Wacker Siltronic Gesellschaft Für Halbleitermaterialien AG, Burghausen (DE)

( * ) Notice: Subject to any disclaimer, the term of this patent is extended or adjusted under 35 U.S.C. 154(b) by 108 days.

(21) Appl. No.: 09/704,315

(22) Filed: Nov. 2, 2000

(30) Foreign Application Priority Data

Nov. 4, 1999 (DE) .......................................... 199 53 152

(51) Int. Cl.⁷ .................................................. C25F 5/00
(52) U.S. Cl. ............................... 134/1.3; 134/2; 134/3; 134/26; 134/27; 134/28; 134/29; 134/34; 134/41; 134/902; 216/52; 216/53; 216/96; 216/99; 438/906
(58) Field of Search ............................ 134/1.3, 2, 3, 1, 134/26, 27, 28, 29, 902, 34, 41; 216/52, 53, 96, 99; 438/906

(56) References Cited

U.S. PATENT DOCUMENTS

| 5,451,267 | A |   | 9/1995  | Stadler et al. |            |
|-----------|---|---|---------|----------------|------------|
| 5,494,862 | A | * | 2/1996  | Kato et al.    | 438/693    |
| 5,656,097 | A |   | 8/1997  | Olesen et al.  |            |
| 5,714,203 | A |   | 2/1998  | Schellenberger et al. |     |
| 5,837,662 | A | * | 11/1998 | Chai et al.    | 134/3      |
| 5,922,136 | A |   | 7/1999  | Huang          |            |
| 6,230,720 | B1| * | 5/2001  | Yalamachili et al. | 134/1.3 |

FOREIGN PATENT DOCUMENTS

JP      01076726    * 3/1989

OTHER PUBLICATIONS

W. Kern, S.A. Puotinen, RCA Reviews 31, p. 187, 1970.

* cited by examiner

Primary Examiner—Randy Gulakowski
Assistant Examiner—M. Kornakov
(74) Attorney, Agent, or Firm—Collard & Roe, P.C.

(57) ABSTRACT

A process for the wet-chemical surface treatment of a semiconductor wafer following a mechanical surface treatment, in particular following a mechanical surface treatment in a lapping machine, includes a sequence of treatment steps. The process essentially includes a wet-chemical surface cleaning, preferably for neutralizing and eliminating the lapping slurry, an acid etching treatment, preferably for eliminating the mechanically imposed damage and for surface smoothing and removal of metals. There is a final step of drying and rendering the cleaned and etched surface hydrophilic.

3 Claims, No Drawings

PROCESS FOR THE WET-CHEMICAL SURFACE TREATMENT OF A SEMICONDUCTOR WAFER

BACKGROUND OF THE INVENTION

1. Field of the Invention

The present invention relates to a process for the wet-chemical surface treatment of a semiconductor wafer following a mechanical surface treatment, in particular following a mechanical surface treatment in a lapping machine, by means of a sequence of treatment steps in which various agents act on the surface of the semiconductor wafer.

2. The Prior Art

The ever-increasing miniaturization involved in the production of electronic components leads to ever higher demands being imposed on the surface quality of the semiconductor materials, such as in particular silicon, which are generally used in wafer form. This applies not only to the geometric quality of the surfaces, but also to their cleanliness, chemical condition, and freedom from particles and spots.

To enable these parameters to be reproducibly influenced and controlled, wet-chemical surface treatment processes in particular and devices for these processes have been developed. These processes and devices are used in particular after mechanical surface treatments, such as grinding, lapping or polishing. According to the prior art, these processes are distinguished by a sequence of treatment steps in which various aqueous, acidic or alkaline agents and/or agents which have been treated with gases act on the surfaces.

Prior art examples include U.S. Pat. No, 5,714,203, and U.S. Pat. No. 5,451,267 and the sequence of wet-chemical treatment steps described by W. Kern and D. A. Puotinen in RCA Reviews 31, 187 (1970). These documents disclose a sequence of cleaning steps, rinsing steps and steps for rendering the surface hydrophilic and hydrophobic, and are mentioned here as being representative of the prior art.

The drawback of the abovementioned wet-chemical cleaning and etching processes is that semiconductor wafers which are strongly contaminated by a mechanical surface treatment, in particular by a mechanical surface treatment in a lapping machine, cannot be processed.

SUMMARY OF THE INVENTION

It is an object of the present invention to combine wet-chemical surface treatment processes, such as cleaning and etching processes, so that they are suitable for treating, in particular cleaning, semiconductor wafers following a mechanical surface treatment, and in particular following a mechanical surface treatment in a lapping machine.

The above object is achieved according to the invention by a process for the wet-chemical surface treatment of a semiconductor wafer following a mechanical surface treatment, in particular following a mechanical surface treatment in a lapping machine, by means of a sequence of treatment steps in which various agents act on the surface of the semiconductor wafer, comprising the following sequence of treatment steps (a) to (j):

(a) holding a semiconductor wafer in an acid;
(b) exposing the semiconductor wafer to ultrasound in an alkaline cleaning solution;
(c) using the semiconductor wafer with deionized water;
(d) subjecting the semiconductor wafer to an alkaline etching treatment;
(e) rinsing the semiconductor wafer with deionized water;
(f) treating the semiconductor wafer if appropriate with ultrasound, in an alkaline cleaning solution;
(g) subjecting the semiconductor wafer to a treatment which renders said wafer hydrophilic;
(h) subjecting the semiconductor wafer to an acid etching treatment;
(i) rinsing the semiconductor wafer with deionized water;
(j) finally drying the semiconductor wafer and rendering hydrophilic said wafer.

The process according to the invention essentially comprises a wet-chemical surface cleaning, preferably for neutralizing and eliminating the lapping slurry, an acid etching treatment, preferably for eliminating the mechanically imposed damage and for surface smoothing and removal of metals, and a final step of drying and rendering the cleaned and etched surface hydrophilic.

Following a mechanical surface treatment, in particular following a mechanical surface treatment in a lapping machine, the semiconductor wafer is held in an acid in step (a), preferably for between 1 and 12 h. Inorganic or organic acids, such as for example hydrochloric acid, formic acid, acetic acid or citric acid, are preferable. Holding in an aqueous acid solution is necessary in order to neutralize the lapping slurry which still adheres to the surface. Thus this will avoid initial etching in the shape of so-called lapping diamonds. Even low concentrations of the acid in the aqueous acid solution are sufficient for neutralization. Thus it is preferable to use acid concentrations of from 0.01% to 0.5% by weight of acid and particularly preferably from 0.1% to 0.5% by weight of acid. The acid concentration is based upon the total weight of the aqueous acid solution.

Then, the semiconductor wafer is cleaned, and if appropriate exposed to ultrasound, in an aqueous alkaline cleaning solution in step (b) with a concentration of preferably from 1% to 25% by weight, and particularly preferably from 5% to 15% by weight. All percents by weight are based upon the total weight of the aqueous alkaline solution. The alkaline cleaning agent in the aqueous cleaning solution rearranges the particles which are to be cleaned off and thus assists with the operation of detaching the particles by means of ultrasound. Without the action of ultrasound, the cleaning action is lower, which means that longer treatment times or more treatment baths are required in order to clean the wafers. The alkalinity of the cleaning agent provides slight initial etching of the silicon surface in the submicron range and thus assists with the cleaning action. The aqueous alkaline cleaning agent solution is at a temperature of preferably from 20° to 80° C. This temperature range assists with the initial alkaline etching of the surface, while there is no formation of bubbles, which would impair the action of the ultrasound.

Following this wet-chemical surface treatment, the semiconductor wafer is rinsed in step (c) with ultrapure deionized water. The aqueous alkaline cleaning solution has to be completely washed off the wafers, in order to prevent the following treatment steps from being impaired by entrained media.

Then, the semiconductor wafer is subjected in step (d) to an alkaline etching treatment in an aqueous alkali metal hydroxide solution. The etching abrasion takes place in order to assist with the cleaning. Particles which, despite the previous cleaning steps, are still securely anchored on the surface or in the microcrack zone caused by the lapping are removed or exposed by the etching attack and the associated detachment of the top layers of silicon in the semiconductor wafer. The alkaline etching treatment preferably takes place in an aqueous alkaline solution, and preferably an aqueous sodium hydroxide solution or an aqueous potassium hydroxide solution. The etching attack during alkaline etching is directionally dependent (anisotropic etching). In addition, the alkaline etch is concentration-dependent and is temperature-dependent. If an aqueous potassium hydroxide solution is used as the etching medium, the etching rate is proportional to the fourth power of the concentration of water in the aqueous potassium hydroxide solution. The maximum etching rate is reached when the concentration of potassium hydroxide in the aqueous solution is approximately 20% by weight. The preferred and particularly preferred concentration and temperature ranges are set in such a way that after the etching a homogenous surface in terms of shine, roughness and surface structure in the microscopic range is formed on the silicon wafer. The concentration of the aqueous alkaline solution is preferably from 40% to 60% by weight of base and particularly preferably from 45% to 55% by weight of base. The temperature of the alkaline solution is preferably from 90° to 130° C., and particularly preferably from 110° to 125° C. The In the preferred temperature range, the chemical reaction proceeds homogeneously and can be controlled successfully, so that there are no inhomogeneities on the silicon wafer with regard to the surface properties such as shine, roughness and surface structure in the microscopic range, and there are no spots visible on the wafers. At a lower temperature, the surface structure changes in the microscopic range. At higher temperatures, the etching solution begins to boil, which prevents homogeneous etching.

Following the alkaline etching treatment of step (d), the semiconductor wafer is rinsed with deionized ultrapure water in step (e), preferably at room temperature, in order to wash off the adhering film of OH⁻.

In order to clean off exposed particles which are still adhering to the wafer surface, the semiconductor wafer is treated in step (f), in an alkaline cleaning solution, if appropriate with ultrasound. The alkaline aqueous cleaning solution has an alkaline concentration of preferably from 1% to 25%, and particularly preferably from 5% to 15%. The alkaline concentration is based upon the total weight of the aqueous alkaline solution. The alkaline cleaning agent is preferably at a temperature of from 20° to 80° C. Following this wet-chemical surface treatment, the semiconductor wafer is again rinsed with deionized ultrapure water.

Then, the semiconductor wafer is rendered hydrophilic in step (g). This is preferably carried out by means of a process as described in U.S. Pat. No. 5,714,203. This treatment of rendering the wafer hydrophilic in step (g) ensures that during a subsequent acid etching treatment the etching starts homogeneously, since a hydrophobic wafer would react with gases in the atmosphere.

The semiconductor wafer which has been rendered hydrophilic is then subjected to an acid etching treatment in step (h), in an aqueous etching mixture which essentially contains HF, HNO$_3$ and an inert gas which is dissolved in the mixture. This preferably takes place using a process and a device for carrying out the process as described in U.S. Pat. No. 5,451,267. After this wet-chemical surface treatment, the adhering acid is removed from the semiconductor wafer using deionized ultrapure water in step (i), in particular in order to stop the etching reaction.

The semiconductor wafer is expediently then dried and rendered hydrophilic in step (j). This is preferably carried out by means of HF and O$_3$, for example using a process as described in U.S. Pat. No. 5,714,203. However, any other process for drying semiconductor wafers and rendering them hydrophilic is also suitable.

DETAILED DESCRIPTION OF PREFERRED EMBODIMENTS

The performance of the process according to the invention and the sequence of treatment steps according to the invention, in which various agents act on the surface of the semiconductor wafer, is illustrated using the following Example. This Example is not intended to be limitative of the present invention.

EXAMPLE

The Example represents the improvement in quality in terms of visually detectable spots. The assessment and inspection were carried out under neon light and haze light. The types of spots were classified according to their origin. Handling spots result from inhomogeneities on the wafer surface which are caused in particular by manual handling of the wafers and drying. Surface inhomogeneities result from inadequate cleaning after a mechanical surface treatment, in particular after lapping of the surface.

TABLE 1

| Cause of spots | Number of wafers in % | Reject rate in % with process according to the prior art | Reject rate in % with process according to invention |
| --- | --- | --- | --- |
| Handling spots: | 100 | 2 | 0.1 |
| Surface inhomogeneities: | 100 | 3 | 0.3 |

TABLE 2

| Surface metals at/cm3 (VPD/TXRF) | Process according to the prior art | Process according to Invention |
| --- | --- | --- |
| Fe | 1 E10 | <5 E08 |
| Cu | 3 E09 | <5 E08 |
| Ni | 1 E10 | <5 E08 |
| Cr | <5 E08 | <5 E08 |
| Zn | 8 E09 | <5 E08 |
| Al (VPD/ICP-MS) | 7 E10 | 5 E09 |
| Na (VPD/ICP-MS) | 5 E10 | <2.5 E09 |

"VPD" means Vapor Phase Decomposition

"TXRF" means Total X-ray Reflection Fluorescence

"ICP" means Inductively coupled plasma

"MS" means Mass Spectrometry

"E" means Experiment.

Accordingly, while a few embodiments of the present invention have been shown and described, it is to be understood that many changes and modifications may be made thereunto without departing from the spirit and scope of the invention as defined in the appended claims.

What is claimed is:

1. A process for the wet-chemical surface treatment of a semiconductor wafer following a mechanical surface treatment, by means of a sequence of treatment steps in which various agents act on a surface of the semiconductor wafer, comprising a following sequence of treatment steps in a given order (a) to (j):
   (a) holding a semiconductor wafer in an acid;
   (b) exposing the semiconductor wafer to ultrasound in an alkaline cleaning solution;
   (c) rinsing the semiconductor wafer with ultrapure water;
   (d) subjecting the semiconductor wafer to an alkaline etching treatment;
   (e) rinsing the semiconductor wafer with ultrapure water;

(f) treating the semiconductor wafer in an alkaline cleaning solution selected from the group consisting of same alkaline cleaning solution of step (b) and a different alkaline cleaning solution from step (b);

(g) subjecting the semiconductor wafer to a treatment which renders said wafer hydrophilic;

(h) subjecting the semiconductor wafer to an acid etching treatment wherein the acid is selected from the group consisting of same acid of step (a) and a different acid from step (a);

(i) rinsing the semiconductor wafer with ultrapure water; and (j) finally drying the semiconductor wafer and rendering hydrophilic said wafer.

2. The process as claimed in claim 1, wherein an aqueous alkali metal hydroxide solution is used in the alkaline etching treatment in step (d).

3. The process as claimed in claim 1, wherein the acid is an aqueous acid solution of an acid selected from the group consisting of hydrochloric acid, formic acid, acetic acid and citric acid.

\* \* \* \* \*